United States Patent [19]

Reams

[11] 4,196,790

[45] Apr. 8, 1980

[54] ACOUSTIC TRANSDUCER HAVING MULTIPLE FREQUENCY RESONANCE

[76] Inventor: Robert W. Reams, 6838 E. 56th St., Tulsa, Okla. 74145

[21] Appl. No.: 890,058

[22] Filed: Mar. 27, 1978

[51] Int. Cl.[2] .................... G10K 13/00; H04R 7/00; H05K 5/00

[52] U.S. Cl. .................... 181/145; 181/152; 181/155; 181/159; 181/199

[58] Field of Search ............... 181/159, 152, 155, 148, 181/145, 144, 156, 199

[56] References Cited

U.S. PATENT DOCUMENTS

| | | | |
|---|---|---|---|
| 2,787,332 | 4/1957 | Fulmer | 181/156 |
| 2,816,619 | 12/1957 | Karlson | 181/148 |
| 2,819,772 | 1/1958 | Bryan | 181/145 |
| 2,896,736 | 7/1959 | Karlson | 181/148 |
| 3,590,941 | 7/1971 | McKenzie | 181/145 |

*Primary Examiner*—Stephen J. Tomsky
*Attorney, Agent, or Firm*—Head & Johnson

[57] ABSTRACT

An acoustic transducer for reproduction of sound over a wide frequency band. The transducer consists of an elongated partially enclosed chamber having a sound source at one end and wherein the cross-sectional area of the chamber is decreased with distance along the length of the chamber away from the sound source. A curved wall is included in the chamber to serve as an expanding horn, the lower end of which is provided with an elongated slot aperture which widens exponentially as a function of the length of the chamber through which sound energy is delivered to the aperture of the horn.

9 Claims, 13 Drawing Figures

ACOUSTIC TRANSDUCER HAVING MULTIPLE FREQUENCY RESONANCE

BACKGROUND OF THE INVENTION

1. Field of the Invention

This invention lies in the field of acoustic transducers. More particularly it concerns the design of a "loudspeaker cabinet or enclosure," or sound transducer, which includes a sound source, such as a loudspeaker, a resonance chamber, and an expanding horn, the acoustic energy moving from the resonance chamber to the horn through an aperture in a common wall.

2. Description of the Prior Art

In the art of acoustic transducers, there are many varieties of cabinets of various sizes and shapes, most of them constructed on the basis of an expanding horn. Many of these have convoluted passages of increasingly expanding cross-section, bent in various ways to fit within a simple rectangular cabinet.

None of the prior art, however, has the advantage of this invention which provides a resonance chamber on which a wide band of frequencies can resonate, and an expansion horn to deliver the energy of the resonance through the open front of the transducer.

There is some art showing a closed chamber including a sound source in one wall, and an opening in another wall of the chamber, in the shape of an elongated expanding aperture, by which the sound from the interior of the chamber goes directly into the air. While the prior art devices, and this invention, have an aperture in one wall of a chamber, the art does not show, in addition, the provision of an elongated resonance chamber with the source at one end and with the cross-sectional area of the chamber decreasing as a function of length or distance from the sound source. Nor do they simultaneously provide an expansion horn with a common wall to the chamber, in which the aperture is positioned, and in which the narrow portion of the aperture is positioned adjacent the small cross-section of the horn, and the wide position of the aperture is positioned near the wide cross-section of the horn.

SUMMARY OF THE INVENTION

It is a primary object of this invention to provide a sound transducer which has a resonance system which will simultaneously resonate at a multiplicity of frequencies covering a wide band.

It is further an object of this invention to provide a resonance chamber having an elongated closed chamber in which the cross-section varies from a first end having the sound source, to a distant end in which the cross-section decreases, and one wall of the chamber has an elongated aperture in which the narrow portion of the aperture is near the sound source and is near the small portion of horn and the wide portion of the aperture is near the distant end of the chamber and the wide portion of the horn, the horn being a part of the transducer assembly.

It is a still further object of this invention to provide a unit transducer in which the closed chamber and the horn are fitted into a rectangular cabinet.

It is a still further object to provide a transducer which can be built in a "left-handed" and "right-handed" configuration, so that two units may be fitted together in different combinations, to provide multidirectional sound production.

These and other objects are realized and the limitations of the prior art are overcome in this invention, by providing a basic transducer configuration which includes a closed elongated resonance chamber which has a selected cross-sectional shape and in which the cross-sectional area decreases as a function of distance along the length axis of the chamber starting from a first end, where the sound source is positioned.

The cross-sectional shape of the chamber comprises a somewhat triangular shape having two lines at right angles, and a third line in the form of an exponential curve joining the ends of the two lines. The two lines at right angles are provided by a first plane wall and a second concave wall attached to the first wall. The third side of the triangle comprises a curved concave wall which is attached to the first and second walls.

The third wall also forms a common wall for an expansion horn. There is a gap in the third wall which is elongated and runs substantially for the full length of that third wall, expanding from a narrow gap to a wide gap with distance along the third wall.

The combination of the closed chamber and the slot forms a gradually varying resonant system comprising the compliance of the air in the chamber, and the inertance of the gap, or aperture. Thus, the combination of chamber and gap form a resonance chamber that will resonate at a series of frequencies covering a wide frequency band. The acoustic energy that resonates in the chamber passes through the aperture into the horn, and expands down the length of the horn and out to the air in front of the transducer.

BRIEF DESCRIPTION OF THE DRAWINGS

These and other objects and advantages of this invention and a better understanding of the principles and details of the invention will be evident from the following description taken in conjunction with the appended drawings in which.

DESCRIPTION OF THE PREFERRED EMBODIMENT

Figure 1:
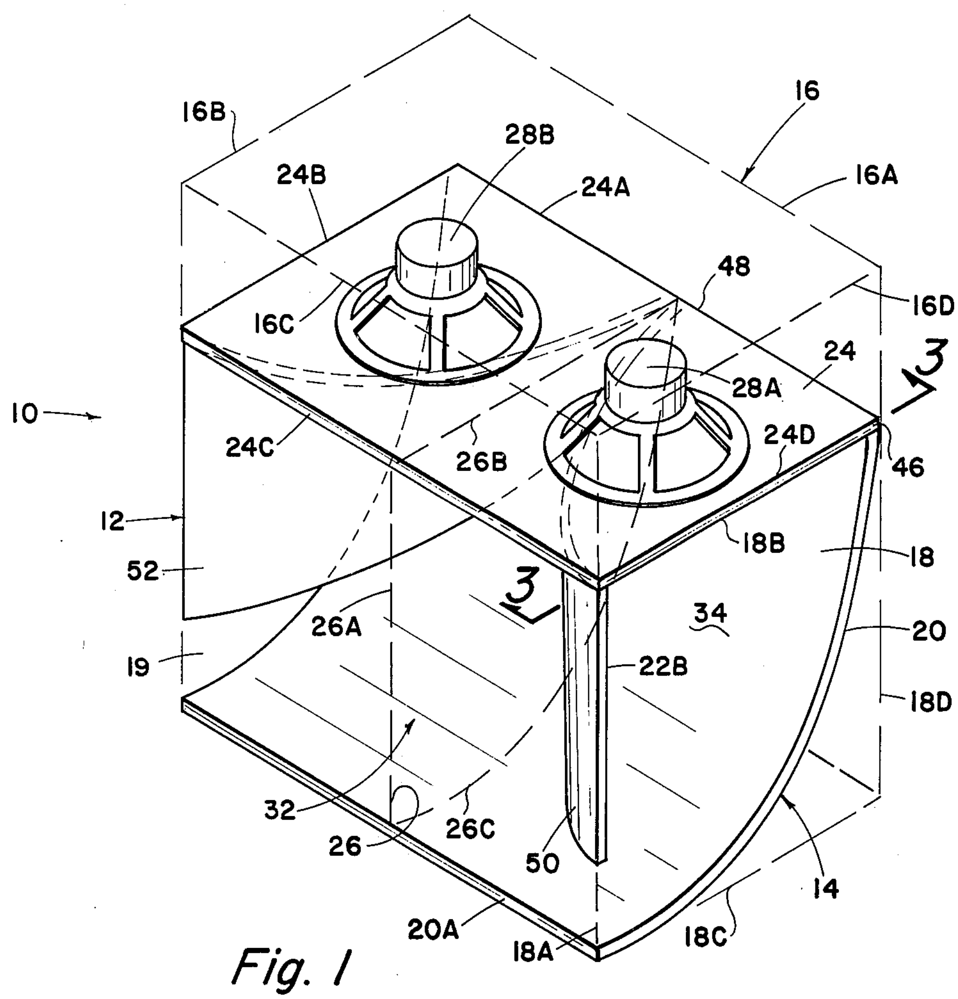
FIGS. 1, 2 and 3 illustrate in three views, one embodiment of this invention.
Figure 2:
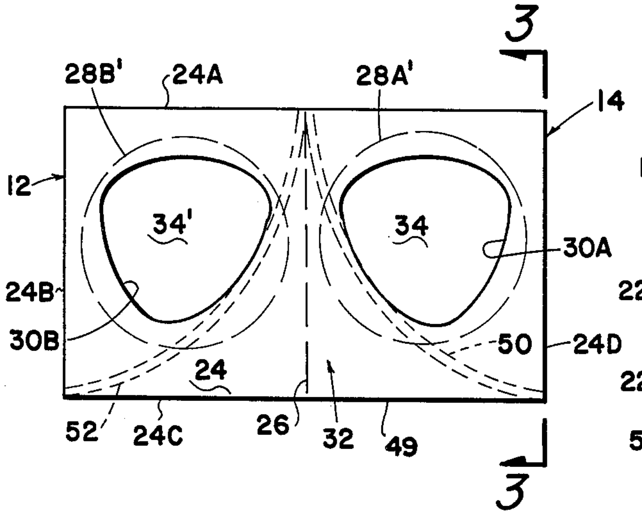
Figure 3:
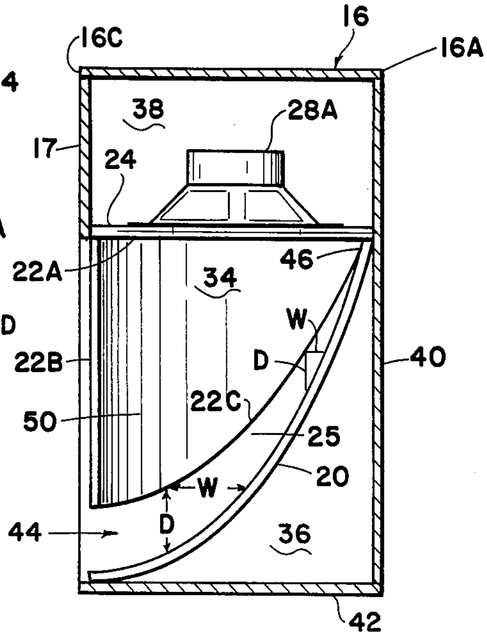
Figure 4:
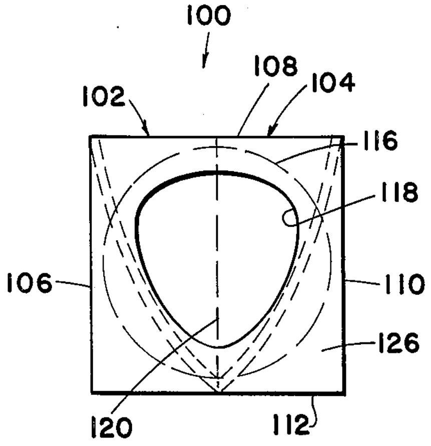
FIGS. 4, 5, 6 and 7 illustrate in four views a second embodiment of this invention.

Referring now to the drawings and in particular to FIGS. 1, 2 and 3, there is shown in three views one embodiment of the transducer of this invention indicated generally by numeral 10. This assembly 10 can be broken into two subassemblies indicated generally by the numerals 12 and 14 which are separated by a plane 26, which divides the top plate 23 in half, and is parallel to the two end walls 18 and 19. Consider first the subassembly or subtransducer 14 which comprises a top plate 24, which has an opening of selected shape 30A and on top of the opening is adapted to be mounted a loudspeaker unit 28A shown in FIGS. 1 and 3.

FIG. 3 is a view in cross-section taken along the plane 3—3 of FIGS. 1 and 2.

There is a first wall 18 which is a plane wall, of rectangular shape, having four edges, a front edge 18A, a top edge 18B, a bottom edge 18C, and a back edge 18D.

Normally, this first wall extends up above the plate 24 and supports a top 16 as shown in FIG. 3. However, so far as the acoustical action of this transducer 14 is concerned, the first wall 18 encloses the end between the top plate 24, a curved wall 20, whose top edge joins the back edge 24A of the top plate 24 along the line 46. This curved wall 20 is concave upwards and its bottom edge 20A extends to the front of the box, or cabinet.

There is a third wall 50 which is concave to the right and is attached to the undersurface of the top plate 24. As shown in FIG. 2, this wall 50 is attached to the second wall 20 along the back edge 24A, at the intersection of the back edge with the plane 26. The front edge 22B is attached to the first wall 18.

The internal space 34 inside the closed volume between the first wall 18 and second wall 20 and third wall 50, is a resonance chamber of greater length than cross-sectional dimension. Furthermore, as will be seen, in FIG. 3, the cross-sectional area of this chamber decreases with distance down from the top plate 24, due to the curvature of the second wall 20.

FIGS. 1 and 2 show that there are two such chambers namely 14 on the right as has just been described, and a similar chamber 12 on the left, which is "left-handed" with respect to the "right-handed" chamber 14. As will be clear from FIG. 2, the curved vertical walls 50 and 52 combine to provide an expanding horn which in combination with the top plate 24 and the bottom or back plate 20, provide a horn of rectangular cross-section which expands from a small end at 48, to a wide rectangular opening 49 at the front of the assembly. Arrow 32 indicates generally the expanding horn, while the arrows 12 to 14 indicate the separate resonance chambers.

As will be seen in FIG. 3, the resonance chamber 34 is not entirely closed, there is an opening between the bottom edge 22C of the third wall 50 and the second wall 20. This gap or aperture starts at the point 46, being quite narrow and expanding, preferably in an exponential manner, to a wide portion at the front edge 22B of the wall 50.

The acoustic theory is clear and simple on the resonance of closed chambers which are open to the atmosphere through a small opening, which comprises, preferably, a short tube of selected length and inner diameter. Such an assembly of a closed chamber and an aperture comprises a Helmholtz resonator, and will resonate acoustically at a selected frequency which is a function, among other factors, of the volume of the chamber, the mass of the air in the chamber, and the dimensions of the aperture.

The gap 25 forms a distributed type of aperture, and can be thought of as involving a complete range of resonance chambers, each having a different size aperture and a different volume, so that a continuous range of frequencies will resonate, utilizing substantially different portions of the volume of the chamber and different portions of the aperture.

Figure 7:
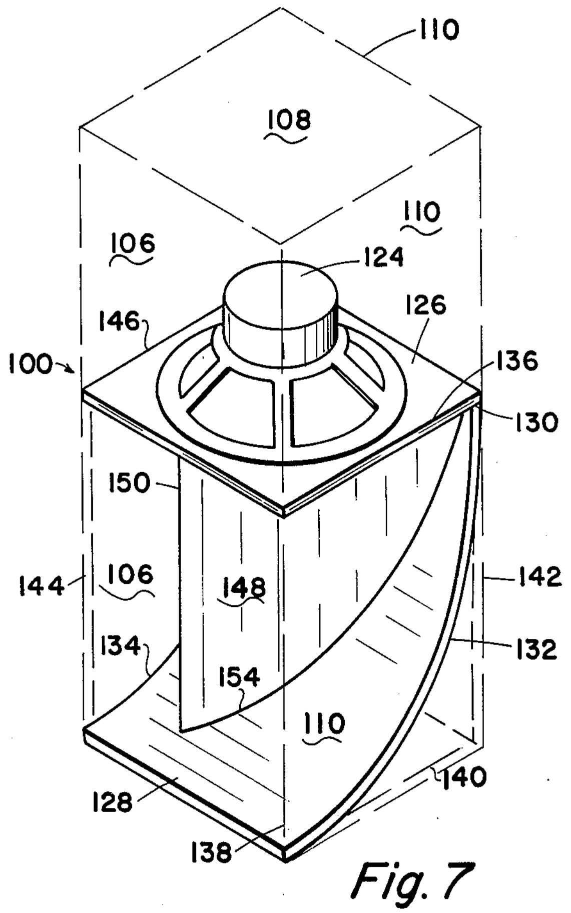

As mentioned previously, and as shown in FIG. 2, an imaginary plane 26 divides the assembly into two similar but oppositely-handed parts, each of which can be considered a subassembly or building block or unit transducer, for more complicated assemblies such as are indicated in FIGS. 1 and 7 for example. This will be explained more fully in relation to FIGS. 8, 9, 10 and 11.

Referring now back to FIG. 1, there are two unit transducers 14 and 12. They share a common second wall 20. They each have side walls 19 and 18 respectively, which are parallel to each other. They each have third walls 50 and 52 which join at a common point 48 on the back wall but curve in opposite directions according to an exponential curve, to attach to the side walls 18 and 19.

It will be clear that the high frequencies will resonate up near the narrow end of the aperture in the region of the point 48, while the low frequencies which will resonate over a larger volume will resonate lower along the gap where it is wider. Thus, the high frequencies are introduced into the horn near the small end 48, and expand along with the lower frequencies that are developed farther along the aperture, and all frequencies then pass out through the opening in the front, confined between the top plate 24, the front edge 20A of the second wall 20, and between the front edges of the two side walls 18 and 19.

Two sound sources 28A and 28B are utilized, one in each of the transducer units 14 and 12, and the total volume of acoustic energy output will be substantially the same from each sound source into each of the transducer units. Thus the presence or absence of a wall in the position of the plane 26 as shown, will not be pertinent. In other words, the plane 26 can be a solid wall 26A, or not, as desired.

Referring now to FIG. 3 as has been previously mentioned, the side walls 18 and 19 will normally be carried up to a height higher than the plate 24 to provide, with a front panel 17, an enclosed volume 38 of selected size which surrounds the back of the loudspeaker diaphragm.

Figure 8:
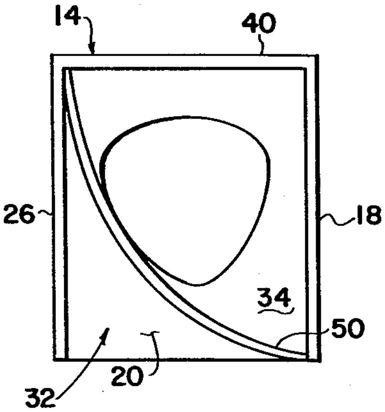
FIGS. 8, 9, 10 and 11 illustrate "left-handed" and "right-handed" subtransducer units, which can be combined in at least two different ways illustrated in FIGS. 10 and 11.
Figure 10:
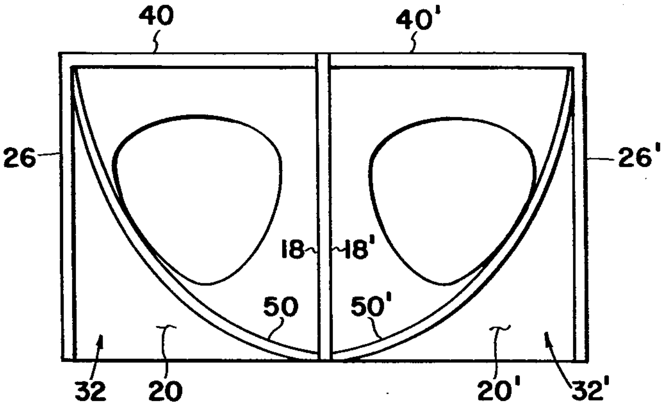
Figure 9:
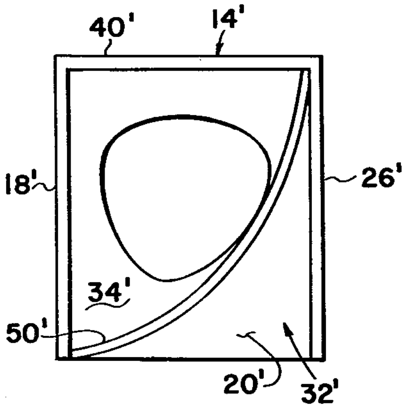
Figure 11:
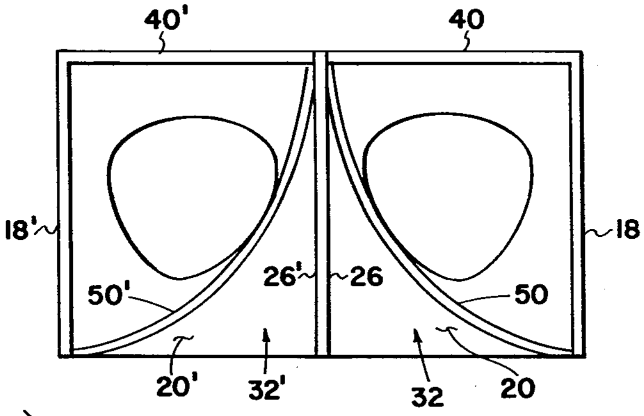

Referring now to FIGS. 8, 9, 10 and 11, there are shown top views of the unit transducers such as 14 and 12. FIG. 8 is a duplicate of the transducer 14 of FIG. 1. FIG. 9 is an opposite handed assembly to that of FIG. 8 like 12, and the corresponding dimensions are indicated by primed numbers. Considering these basic units, they can be applied one to the other as shown in FIGS. 10 and 11. When the two parts 14 and 14' are fitted together with the walls 26 and 26' coincident, the assembly shown in FIG. 11 is provided, which is identical with that shown in FIG. 1. In this case, of course, the units can be made without the side walls 26 and 26' to provide the identical assembly as in FIG. 1.

On the other hand, if the side walls 18 and 18' are brought together the assembly looks like FIG. 10.

Referring now to FIGS. 4, 5, 6 and 7, there are shown four views of an assembly similar to that of FIG. 10, which can be made of the same two subtransducers shown in FIG. 1. For other purposes, the assembly of FIGS. 4, 5, 6 and 7 can be made narrower, so that a single loudspeaker 124 can be used, instead of two as indicated in FIG. 10. Considering the structure illustrated in FIG. 4, the dashed line 120 indicates an imaginary separation of the assembly into two halves showing that there are, in effect, two subtransducers 102 and 104, which are identical except for being mirror images of each other and both being fed by the single speaker unit 124.

The top plate 126 can be continuous over the two subtransducers 102 and 104, similarly, the back plate 132 can be continuous over the two subtransducers 102 and 104, the outside walls 106 and 110 are parallel to each other, and there may or may not be a central dividing wall 120 between the two units. In other words, the combination unit can be constructed directly, or transducers can be constructed, which then can be combined in different ways.

Figure 6:
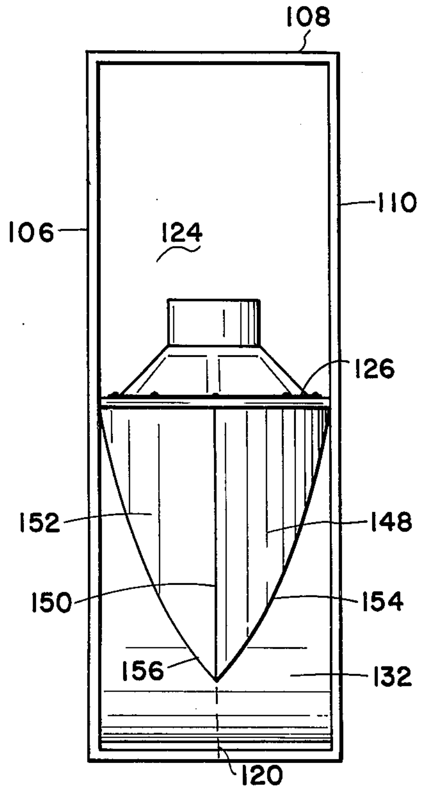
Figure 5:
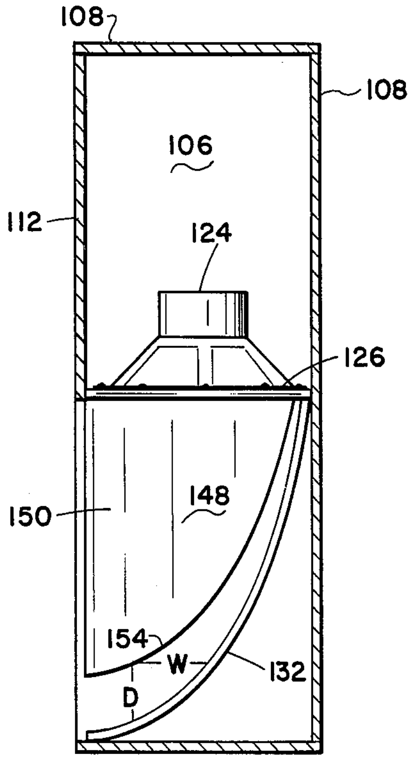

As shown in FIGS. 5 and 6, there is a concave second wall 132. There are two third walls 148 and 152, curved in opposite directions, and joining along a junction 150, near the front of the assembly. There is an elongated aperture, or gap, between the bottom edges 154 and 156 of the walls 148 and 152, to the back plate 132.

Both the curvature of the second wall 132, and the bottom edge 154 of the wall 148 are exponential curves, and the dimensions D and W of the gap are designed in accordance with the range of frequencies which are to be reproduced.

In other respects, the assembly of FIGS. 4, 5, 6 and 7, are similar to that of FIGS. 1, 2 and 3.

PRACTICAL CONSIDERATIONS

In the midst of many bass reinforcement applications, there have always been the problems of size, weight, and cost. Possible elimination of all these drawbacks would result in the development of a highly desirable bass enclosure. This invention has provided a relatively flat response from 60 to 600 Hz, only 9 dB down at 40 Hz, with dimensions of 3′×3′×2′, and a weight of about 90 pounds without drivers. Although the cabinet is meant to be used in extreme high-level bass reproduction, it is small and light enough to be used from the ceiling as a low distortion low end speaker for disco applications, etc. Fidelity remains very high in the low bass region, even at high sound power level. This would lend it very well to use as a public address, or organ speaker in churches. The small size and light weight of the cabinet make selecting a location very easy. The cabinet is box-shaped, making stacking, storing, and transporting very simple, as opposed to massive bass horns which are not made for ease of stacking without special hardward. The folded bass horns are stackable but the relatively short throat and small mouth result in a cabinet with non-useable output below 100 Hz.

THEORETICAL CONSIDERATIONS

With the ever growing popularity of large indoor and outdoor concerts, it would seem that the problems of reproducing bass at high levels would long also have been solved. Granted, the aspects of low end response have been solved to an extent. However, there is a lot to be desired in modern day low end cabinets.

Current high sound level products are, for the most part, horns, their main virtues being relatively high efficiency and better pattern control. Since large power production is often required, the horn was the only satisfactory answer to the problems involved. But problems do exist within the presently available horns. A properly constructed bass horn designed to operate in the low bass region will reach massive dimensions, making it very difficult to transport and set up, not to mention the amount of space occupied. To avoid these losses in transportation, set-up time, and stage room, compromises are made in design that for the most part degrade the linearity and low bass efficiency of the horn. The result is often a unit with a certain glare that detracts from the listenability of the entire sound system. One approach is to fold the horn. Although the depth of the cabinet is reduced to a useable dimension, higher frequencies are attenuated to the point that the cabinet is hardly useable above 350 Hz, forcing a three-way situation. The rear-loaded horn is also hampered with poor high frequency response and the inability to project the bass frequencies.

Figure 12:
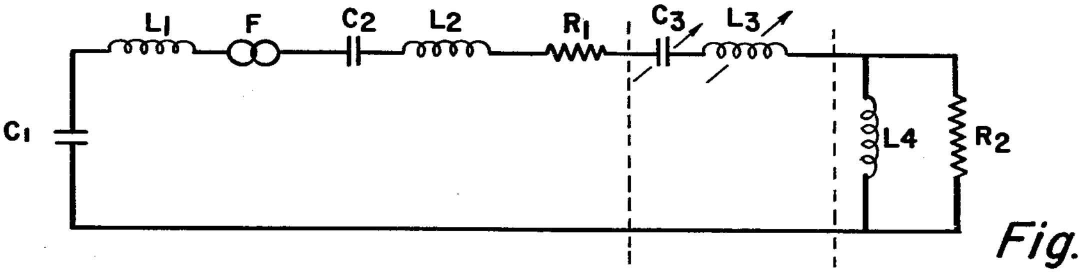

Under optimum conditions this enclosure represents a separate resonant circuit for each frequency or combination of frequencies within the designated range. That is, in order to become resonant across a broad range of frequencies, there has to exist a different compliance and inertance presented to each different frequency introduced to the chamber by the speaker. Under analysis, the electrical analog of the cabinet chamber represents a series LC combination which is tunable for resonance. The electrical equivalent circuit of the acoustic system is shown in FIG. 12.

Where:

$L_1$: Cabinet Air Inertance,
$L_2$: Loudspeaker Cone Inertance,
$L_3$: Chamber Slot Inertance,
$L_4$: Environmental Air Inertance,
$C_1$: Cabinet Air Compliance,
$C_2$: Loudspeaker Surround Compliance,
$C_3$: Chamber Air Compliance,
$R_1$: Loudspeaker Surround Resistance,
$R_2$: Environmental Air Resistance.

The chamber itself is represented by the $C_3L_3$ combination with values which are frequency dependent. In order to show representative calculations, examination will be done at a single frequency. In the case of a single given frequency, the chamber compliance $C_3$ will have a reactance of $1/wC$ or $\frac{1}{2}fC$ and the adjacent slot inertance $L_3$ will have a reactance of $wL$ or $2fL$. If resonance is to occur, these reactances must be equal, or $wL = 1/wC$ and the equation for determining the frequency of a series resonant circuit $f = \frac{1}{2}LC$ becomes $f = \frac{1}{2}C_3L_3$.

Figure 13:
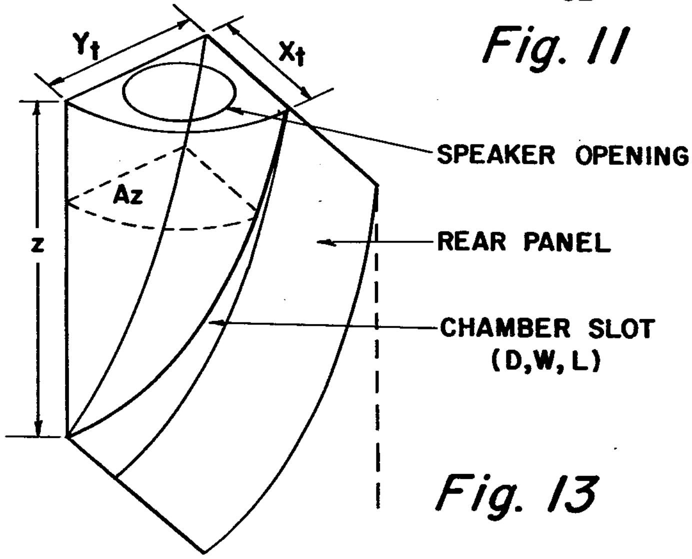
FIGS. 12 and 13 are figures to be used in conjunction with the theoretical considerations.

Consideration for the polar pattern, driver size, and upper frequency limit loading dictated the geometry of the basic chamber. The inside chamber wall was chosen as exponential, as was the rear panel. The slot, or aperture, was then defined by the chamber volume at a particular chamber depth z. Although the mass of the air in the slot is now calculable, its exact dimensions due to practical considerations cannot be determined at this point. The chamber is shown in FIG. 13 with all pertinent notations and variables indicated.

An equation for calculating the volume V of the chamber at any particular distance z can be formulated as:

$$dV_z = A_z dz$$

then, $$V_z = \int_{o}^{Z_T} A_z dz \qquad (1)$$

$A_z$ was then formulated as:

$$A_z = Y_{tx}X_t - K_1 \int e^{Y_{tx}} dY_{tx} \qquad (2)$$

$X_t$ is fixed at a figure dependent upon cabinent dimensions. $Y_{tx}$ must be a function of z and was determined to be:

$$Y_{tx} = K_2[\ln \frac{(4K_2 - z)}{K_2} + 2.6] \qquad (3)$$

$K_1$ and $K_2$ are constants which appear due to curve fitting and whose magnitudes are dependent on cabinet dimensions.

After manipulation of Equations 1, 2 and 3, the equation for the area at a given point z is given by:

$$A_z = K_2[\ln\frac{(4K_2 - z)}{K_2} + 2.6]X_t + \frac{K_1K_2}{4K_2}\int e^{K_2[\ln\frac{(4K_2 - z)}{K_2} + 2.6]}dz + K_1K_2\int\frac{e^{K_2[\ln\frac{(4K_2 - z)}{K_2} + 2.6]}dz}{z} \quad (4)$$

Because of the complexity of equation 4, it is desireable to obtain solutions at increments of 1 cm. Calculated volumes were summed for the total volume at any point z. The total volume of each chamber is 3.03 $ft^3$ or 85,895.26 $cm^3$. The chamber compliance at a depth z was calculated by equations, 2 and 3.

$$C = V_z/\gamma P_o \quad (5)$$

with the slot inertance given by:

$$L = l_5P/d_sw_s \quad (6)$$

Combining Equations 5 and 6 with Equation 1 and solving for slot height gives:

$$\frac{V_zw^2l_s}{K_3w_s} = ds\ K_3 = \frac{\gamma P_o}{\rho} \quad (7)$$

The slot height was then calculated and varies from 2.6 cm at maximum chamber volume to 8.9 cm at minimum chamber volume. The maximum width of the aperture is a relatively small part of the length of the resonant chamber.

REVIEW

What has been described is a unique design and construction of a unit acoustic transducer assembly, which provides, in combination, a unique shaped resonant chamber of length greater than transverse dimension, and of reduced cross-section as a function of length from a first end, across which the sound source is positioned, and an exponential horn which is provided in close conjunction with the resonance chamber. A common wall divides the two resonance chambers and the horn. An elongated gap or aperture is in this wall, which starts at the small end of the horn and expands to greater width toward the mouth of the horn, which occurs at points more distant from the first end of the compression of the chamber.

Multiple unit transducers can be constructed in opposite handed manner, and can be combined in different ways to provide sound reproduction assemblies of high fidelity, broad frequency hand, and wide sound aperture, and directivity.

Since the frequency response of the assembly involves the resonance frequencies to which the combination of the resonance chamber and the elongated aperture are designed, it is possible to provide two units which have substantially the same resonance chamber but have differently designed apertures and therefore have different frequency bands of resonance so that different frequency bands can be accentuated, with each of the different subassemblies to provide any desired pass band versus sound power level that may be desired.

While the invention has been described with a certain degree of particularity, it is manifest that many changes may be made in the details of construction and the arrangement of components. It is understood that the invention is not to be limited to the specific embodiments set forth herein by way of exemplifying the invention, but the invention is to be limited only by the scope of the attached claim or claims, including the full range of equivalency to which each element or step thereof is entitled.

What is claimed:

1. An acoustic transducer for high efficiency, high fidelity, production of sound, over a wide frequency band including low frequencies, comprising;

(a) at least a first sound source;

(b) at least a first elongated chamber;

(c) means to mount said sound source in a first end of said chamber;

(d) a first curved wall member within the chamber and having a concave surface thereof facing inward to said chamber, said first curved wall member serving to reduce the cross-sectional area of the chamber as a function of distance along said chamber from said first end to a second opposite end;

(e) at least a second curved wall member, the parallel elements thereof being longitudinally disposed within the chamber and a third wall member disposed within the chamber and spaced from the second wall member, said second and third wall members serving to form an expanding horn contiguous to said chamber; and (f) an elongated slot aperture between one edge of the second curved wall and the concave surface of the first curved wall providing an elongated opening from the first end of said chamber to the opposite end of said chamber, the width of said opening increasing exponentially along the length of said chamber.

2. The acoustic transducer as set forth in claim 1 in which the curvature of said first curved wall member is an exponential curve starting from said first end of said chamber.

3. The acoustic transducer as set forth in claim 1 in which the curvature of said second curved wall is exponential in shape.

4. The acoustic transducer as set forth in claim 1 including a second source securable to said means to mount said sound source and spaced from the first sound source, wherein said third wall member is a curved wall member, the size and shape of said wall member being a mirror image of said second curved wall member, said first and second sound sources being positioned with respect to said second and third curved wall members, identically.

5. The acoustic transducer as set forth in claim 4 including a fourth plain wall longitudinally disposed within said chamber dividing the space between the second and third wall members to form a first transducer and associated chamber with said first sound source and a second identical mirror image transducer and associated chamber with said second sound source.

6. The acoustic transducer as set forth in claim 5 in which the length, and cross-section of said first and second chambers and the width of said slot aperture for said first and second transducers are the same, whereby the frequency response of said first and second transducers are substantially the same.

7. A first acoustic transducer for high efficiency, high fidelity, reproduction of sound over a wide frequency band comprising a rectangular enclosure construction having front, rear, top, bottom, left and right side surfaces, the front surface being open, the transducer comprising a sound source, means for mounting the sound source at the top surface of the enclosure, left and right side walls forming said left and right side surfaces, an elongated curved wall member extending from the rear upper edge to the front lower edge of the enclosure between the side walls and having a concave surface facing forwardly and upwardly, a second curved wall member disposed within said chamber, the parallel elements of the curvature of said second curved wall member being vertical, one edge of said second wall member being secured to the front edge of the right side wall, the opposite edge thereof extending toward the rear edge of the left side wall and having a convex surface facing forwardly and toward the left, and an elongated slot aperture between the lower edge of the second curved wall and the concave surface of the first curved wall, the width of said aperture increasing from the left rear edge to the front rear edge thereby providing an elongated opening increasing in width exponentially along the vertical length of said chamber.

8. A transducer as set forth in claim 7 and including a second acoustic transducer constructed as a mirror image of said first acoustic transducer wherein the left side wall of the first transducer is common to the right side wall of the second transducer.

9. An acoustic transducer as set forth in claim 7 and including a second acoustic transducer constructed as a mirror image of said first acoustic transducer wherein the right side wall of the first transducer is common to the left side wall of the second transducer.

* * * * *